(12) United States Patent
Nuttinck et al.

(10) Patent No.: US 7,939,416 B2
(45) Date of Patent: May 10, 2011

(54) METHOD OF MAKING BIPOLAR TRANSISTOR

(75) Inventors: Sebastien Nuttinck, Anvers (BE); Erwin Hijzen, Blanden (BE); Johannes J. T. M. Donkers, Valkenswaard (NL); Guillaume L. R. Boccardi, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/935,924

(22) PCT Filed: Mar. 30, 2009

(86) PCT No.: PCT/IB2009/051326
§ 371 (c)(1),
(2), (4) Date: Oct. 26, 2010

(87) PCT Pub. No.: WO2009/122346
PCT Pub. Date: Oct. 8, 2009

(65) Prior Publication Data
US 2011/0034001 A1    Feb. 10, 2011

(30) Foreign Application Priority Data
Apr. 2, 2008 (EP) .................................. 08103333

(51) Int. Cl.
*H01L 21/8222* (2006.01)

(52) U.S. Cl. .. 438/311; 257/197; 257/198; 257/E21.608

(58) Field of Classification Search .................. 438/311, 438/531; 257/197, 198, E21.608
See application file for complete search history.

(56) References Cited

U.S. PATENT DOCUMENTS

| | | | |
|---|---|---|---|
| 5,466,621 A | 11/1995 | Hisamoto et al. | |
| 7,071,500 B2 * | 7/2006 | Miura et al. | 257/197 |
| 2003/0227036 A1 | 12/2003 | Sugiyama et al. | |
| 2005/0020020 A1 | 1/2005 | Collaert et al. | |
| 2006/0148187 A1 | 7/2006 | Yoon | |
| 2008/0001234 A1 | 1/2008 | Cheng et al. | |
| 2008/0224175 A1 * | 9/2008 | Cheng et al. | 257/197 |
| 2009/0057685 A1 * | 3/2009 | Mochizuki et al. | 257/77 |

OTHER PUBLICATIONS

Suligoj, Tomislav, et al; "A Novel Low-Cost Horizontal Current Bipolar Transistor (HCBT) with the Reduced Parasitics"; Proceedings of the 2004 Bipolar/BiCMOS Circuits & Technology Meeting BCTM 1.3; IEEE, Piscataway, NJ, US; 4 Pages (2004).
International Search Report and Written Opinion for Application PCT/IB2009/051326 (Mar. 30, 2009).

* cited by examiner

*Primary Examiner* — Matthew Smith
*Assistant Examiner* — Christine Enad

(57) ABSTRACT

A method of manufacturing a bipolar transistor is compatible with FinFET processing. A collector region (18) is formed and patterned, base contact regions (26) formed on either side, and a gap formed between the base contact region. A base (28), spacers (30) and an emitter (32) are formed in the gap.

12 Claims, 8 Drawing Sheets

METHOD OF MAKING BIPOLAR TRANSISTOR

The invention relates to a method of making bipolar transistor, in particular to a heterostructure bipolar transistor suitable for integration with CMOS.

As CMOS transistor technology shrinks in size a number of approaches have been used to overcome physical limitations affecting transistor performance. A particularly promising approach is the so-called finFET (fin field effect transistor) approach in which a pair of gates on either side of a raised semiconductor body or fin is used. The finFET may become the dominant geometry of CMOS transistors in the future.

There is significant interest in integrating bipolar transistors with CMOS transistors and in particular with finFET CMOS transistors. Such integrated bipolar transistors have particular application in RF power circuits, or indeed in any circuit integrating bipolar and CMOS circuits. There is thus a significant desire to integrate bipolar and CMOS circuits in a low complexity and hence low cost way.

However, the authors are not aware of any low-complexity integration scheme for such integration.

For example, US2003102227036 mentions integrating heterostructure bipolar transistors (HBTs) with finFETs by manufacturing the HBT transistors after the finFETs.

One scheme that the authors are aware of is provided in Suligoj et al, "A novel low-cost horizontal current bipolar transistor (HCBT) with the reduced parasitics", Proceedings of the 2004 Bipolar/BiCMOS Circuits and Technology Meeting, Montreal, Quebec, Canada, published by the IEEE, pages 36 to 39. This does address the question of integration. However, the transistor manufactured is a horizontal bipolar transistor, not a vertical transistor. Nor is the method particularly simple.

Accordingly, there remains a need for a method of making a bipolar transistor that can be readily integrated into the process flow of a CMOS finFET.

According to the invention there is provided a method of manufacturing a bipolar transistor according to claim 1.

By forming the bipolar transistor in this way the process is highly compatible with finFET processes.

In particular, the collector region of semiconductor may be defined in the same process step as the fins of the finFET, the insulating layer on the sidewalls of the collector region may be defined in the same process step as the gate insulator of the finFET, and the base contact regions may be formed in the same step as the gate conductor of the finFET. Of course, if required, one or more of these process steps may be carried out separately, for example the gate insulator may be separately defined to allow for separate selection of the gate insulator thickness that determines part of the base-collector capacitance.

The step of forming a collector region may include forming the collector region to have a plurality of trenches extending longitudinally between the end region and the central region. In this way the device can use the reduced surface field (RESURF) effect to improve device properties in an easily manufacturable way—it will be noted that the trenches can simply be patterned in the same step that forms the collector region.

For a better understanding of the invention, an embodiment will now be described, purely by way of example, with reference to the accompanying drawing, in which.

The drawings are schematic and not to scale. Like or similar components are given the same reference numerals in the different figures.

Figure 1:
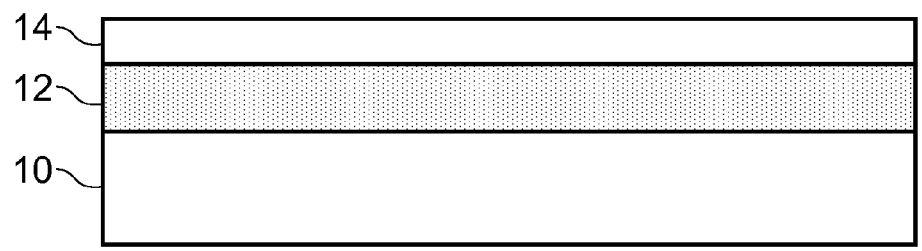
FIGS. 1 to 10 show stages in a method according to the invention in side view.
Figure 2:
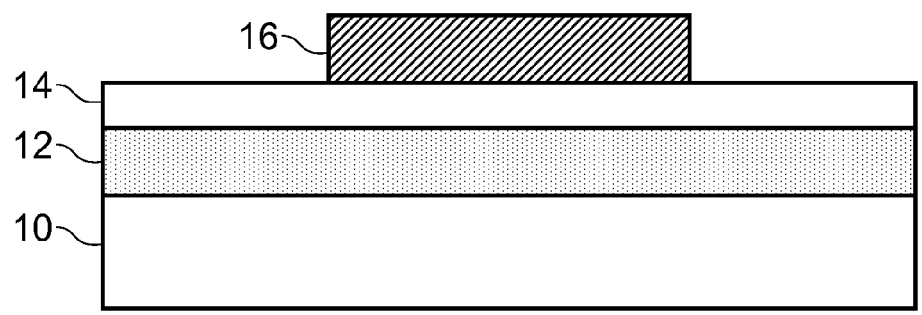

Referring to FIG. 1, a silicon layer 14 is provided on an insulating oxide layer 12 on a silicon substrate 10, making up a silicon-on-insulator structure. In the embodiment, the silicon layer 14 is 60 nm thick and the oxide is 100 nm thick.

A hard mask layer 16 is deposited on the silicon layer and patterned. The hard mask is patterned to have a lateral width (in the direction shown in the drawings laterally across the page) wide enough for an emitter contact at the end of the process. The hard mask layer 16 is 40 nm thick and 150 nm to 500 nm wide in the embodiment in the central region 15 (FIG. 12) between end regions 17.

The hard mask layer 16 is then used as a mask to etch away silicon layer 14. Where the hard mask covers the silicon layer 14, the silicon layer remains forming a silicon collector region 18 in the shape illustrated in FIG. 12 (top view), extending laterally with reduced width in the central region 15 (FIG. 12) where the base and emitter are formed in subsequent steps.

Figure 3:
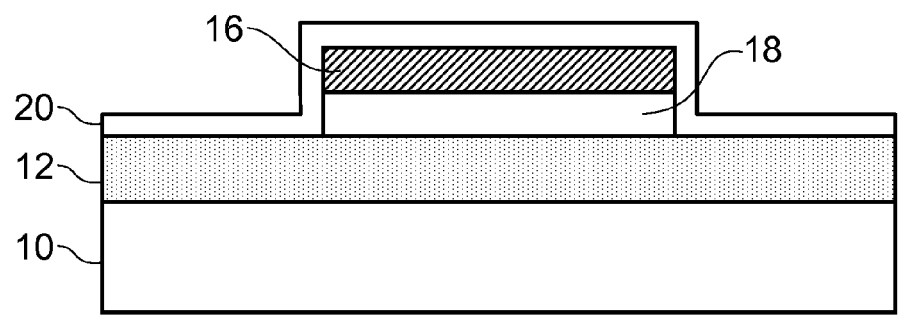

A thin oxide layer 20 is then deposited over the whole surface as shown in FIG. 3. The oxide layer has a thickness in the range 1 to 20 nm.

Figure 4:
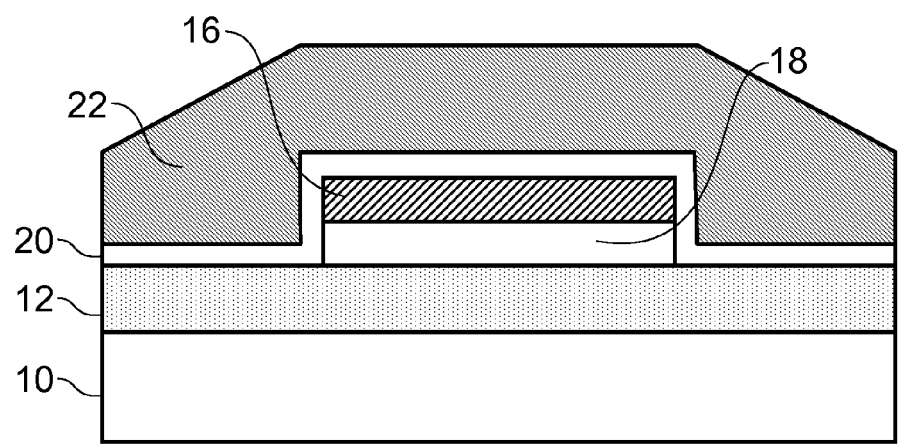

Next, polysilicon 22 is deposited over the whole surface to a thickness in the range 100 nm to 200 nm (FIG. 4). The polysilicon 22 may be patterned at this point.

Figure 5:
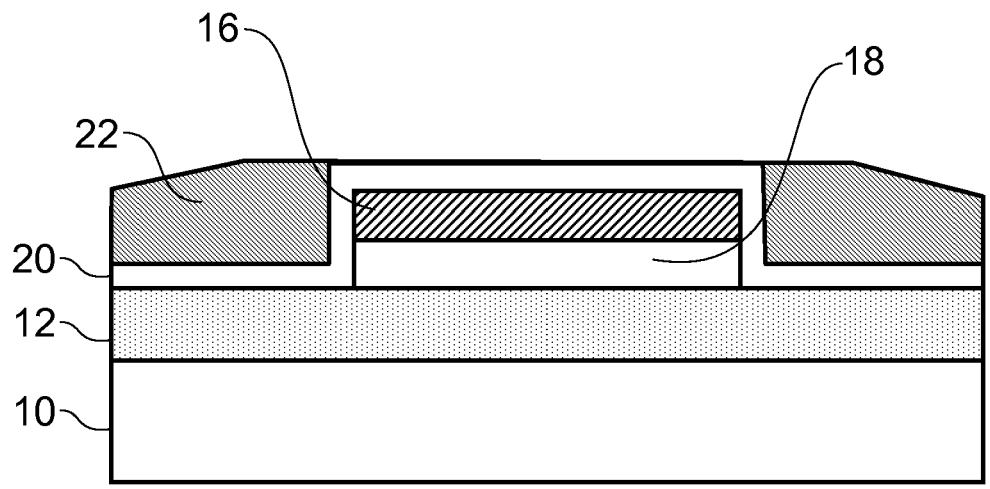

A chemical-mechanical polishing process (CMP process) is then used to etch back the polysilicon 22 to expose the thin oxide layer 20 (FIG. 5).

Figure 6:
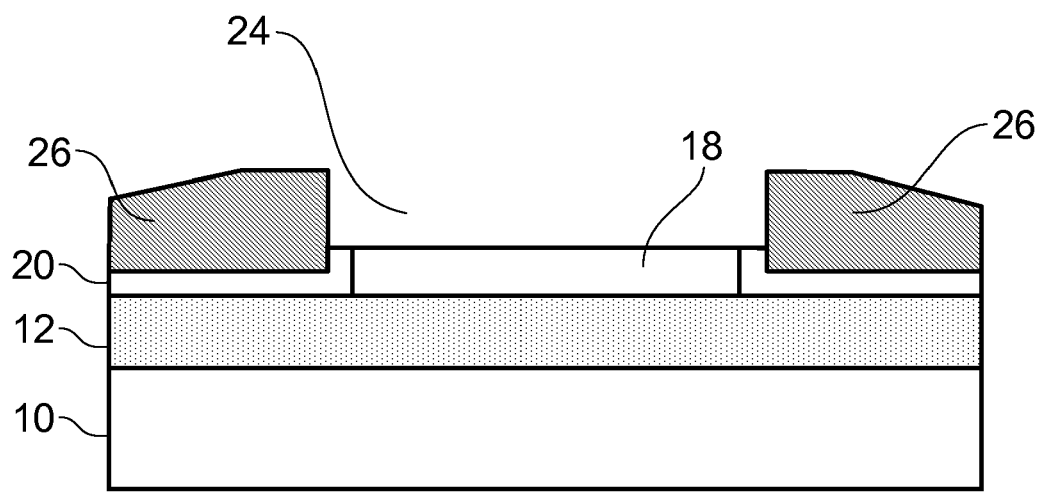

A selective etch process is then used to etch away the hard mask layer 16 and the thin oxide layer 20 adjacent to the hard mask layer 16 leaving the silicon collector region 18 exposed (FIG. 6). The polysilicon layer 22 remains at a higher level with a gap 24 extending between two laterally opposed parts 26 of the polysilicon layer 22.

Figure 7:
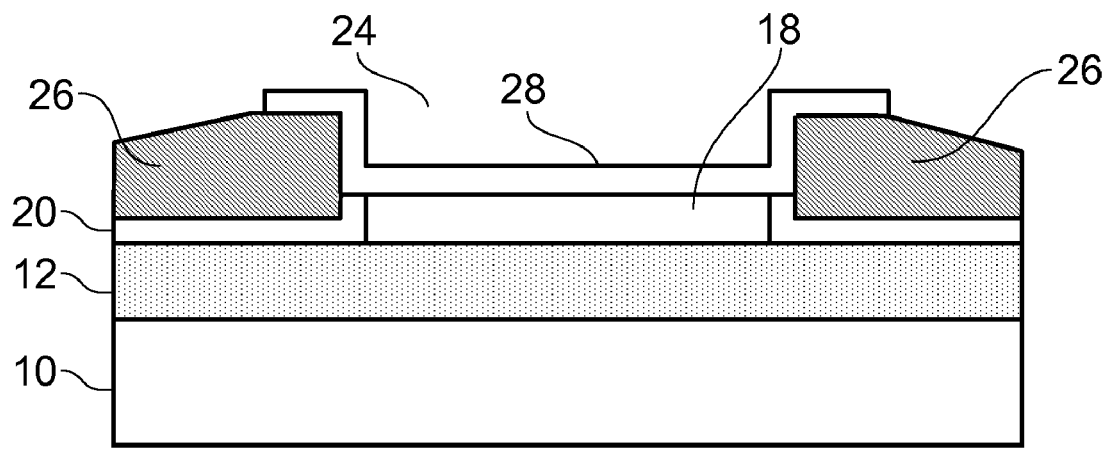

A Si or SiGe base layer 28 is then formed and patterned as illustrated in FIG. 7.

Figure 8:
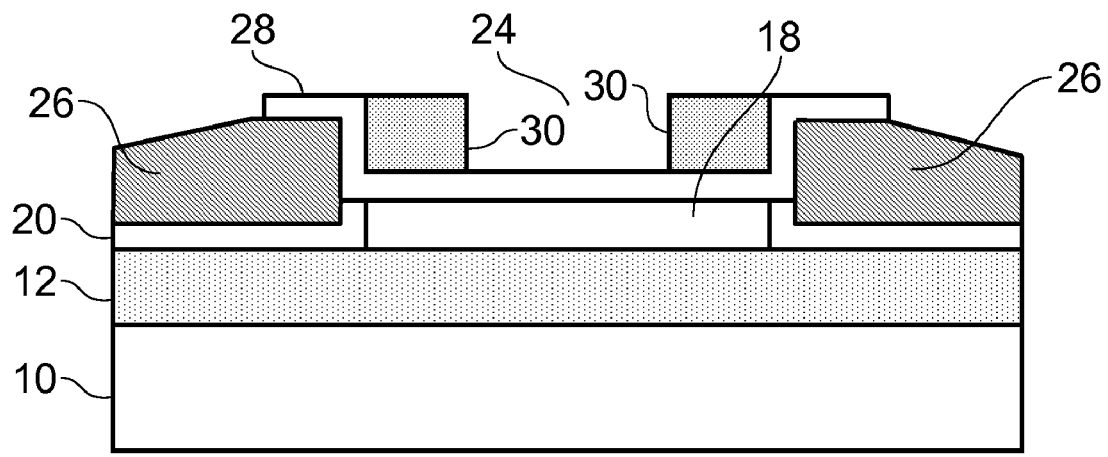

Nitride spacers 30 are then formed adjacent to the sidewalls of the base layer as illustrated in FIG. 8.

Figure 9:
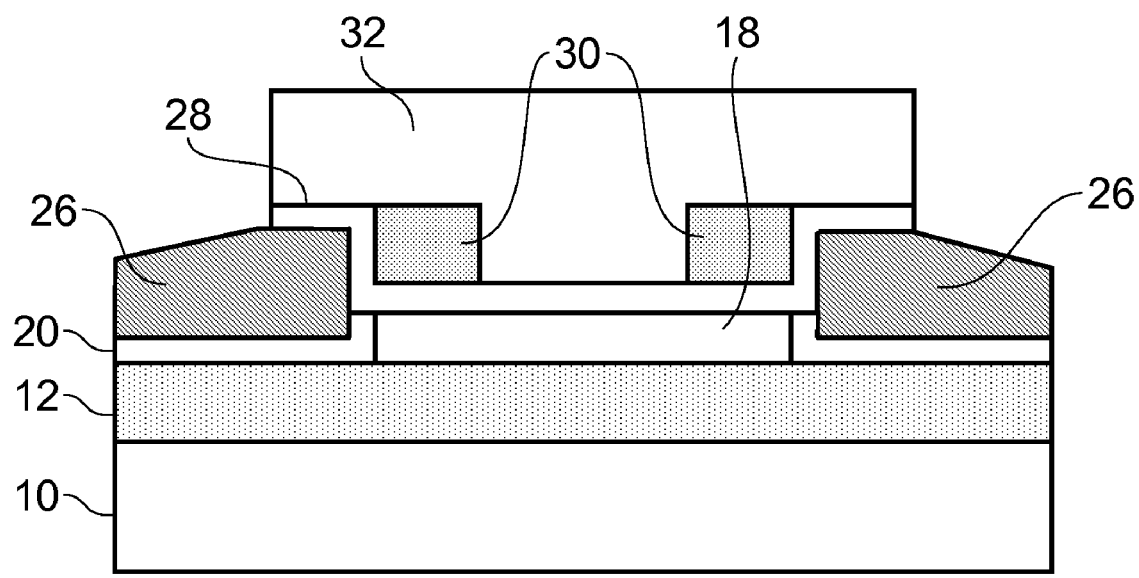
Figure 10:
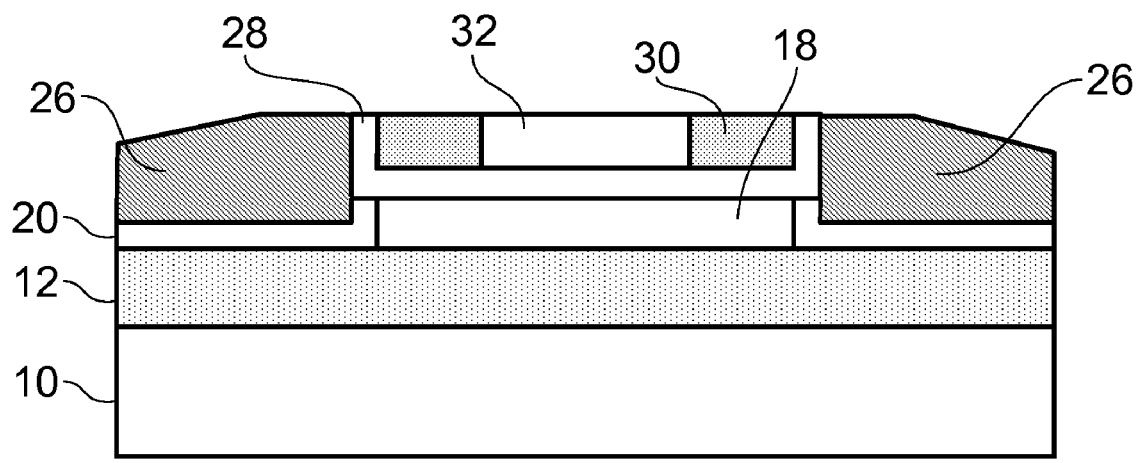

A crystalline or polycrystalline Si emitter region 32 is then deposited over the surface (FIG. 9). This is then etched back to below the top of the spacers 26 (FIG. 10), again using a CMP process.

Figure 11:
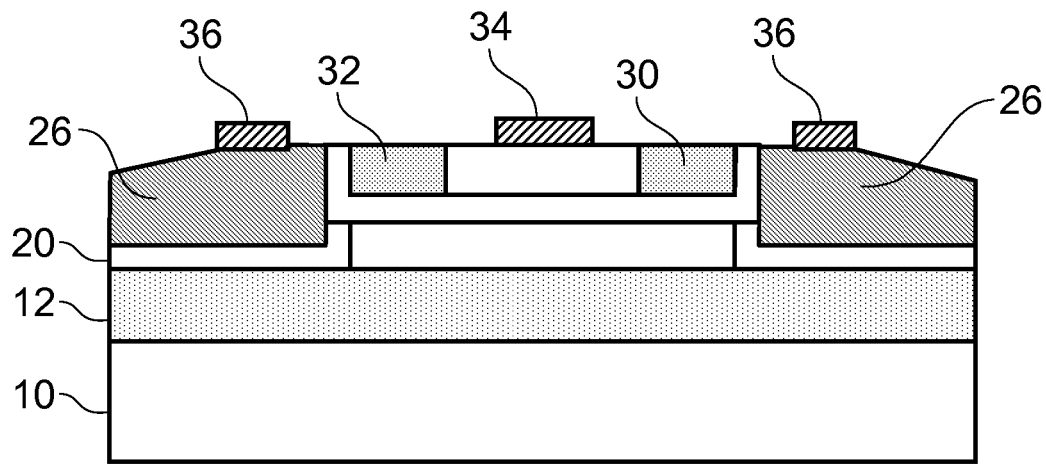
FIG. 11 shows the resulting semiconductor device in side view.
Figure 12:
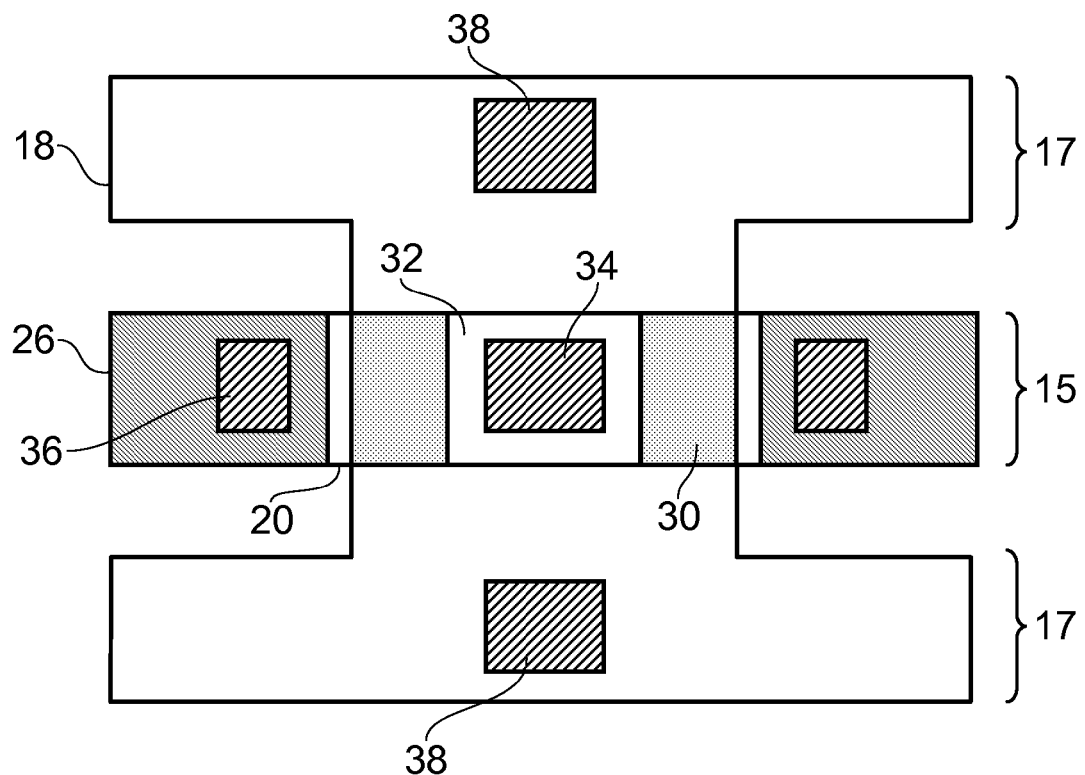
FIG. 12 shows the resulting semiconductor device in top view.

A plurality of contacts are then formed on the upper surface as illustrated in FIGS. 11 and 12, which show an emitter contact 34 on the emitter region 32, base contacts 36 on top of base layer 28 laterally on either side of the emitter region 32, and collector contacts 38 formed on the collector layer 18 longitudinally on either side of the emitter contact 34, where the longitudinal direction is vertical in FIG. 12 and the lateral direction is horizontal in both FIGS. 11 and 12.

Figure 13:
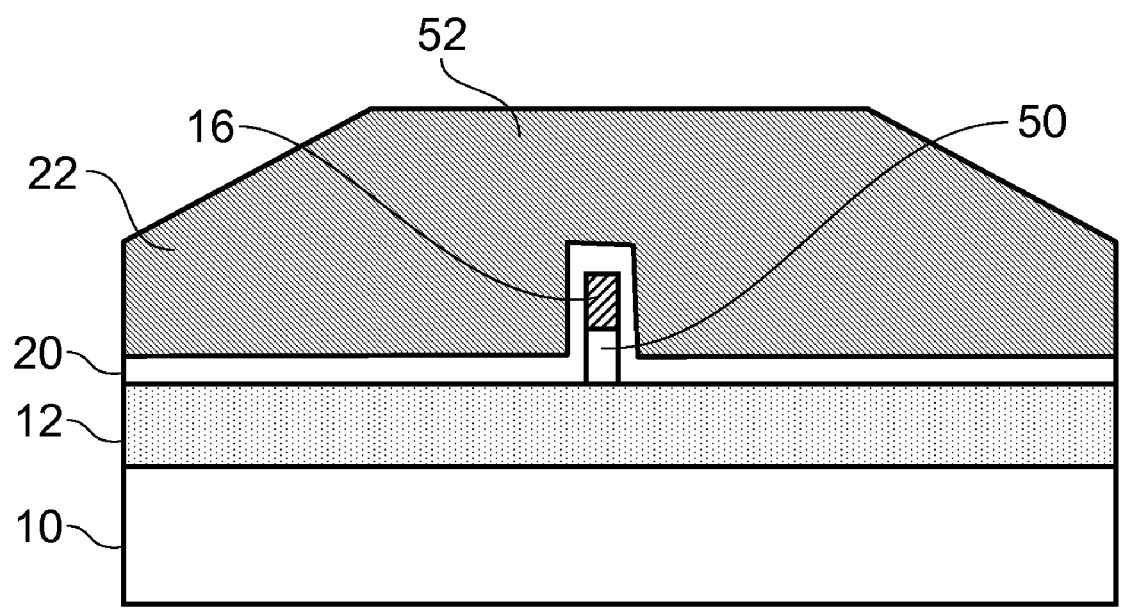
FIG. 13 shows a stage in the manufacture of a finFET on the same substrate.

The above process is compatible with formation of a finFET. In particular, the collector region 18 can be formed and patterned in the same step as the fin 50 of a finFET. The insulating layer 20 forms the gate insulator of the finFET and the polysilicon 22 forms the gate 52 of the finFET. FIG. 13 illustrates this part of the process in the region of a finFET formed on the same substrate as the bipolar transistor shown in FIGS. 1 to 12 at the same stage as shown in FIG. 4 above.

In alternative embodiments separate steps can be used for these processes. In particular, the gate insulator of the finFET may be deposited in a separate step to the insulating layer 20 of the bipolar transistor to allow a thicker insulating layer to be used in the manufacture of the bipolar transistor than the gate if required.

Subsequent processing steps also follow largely the same processing steps to form the finFET as used above to form the heterostructure bipolar transistor of FIGS. 1 to 12.

This compatibility with finFET processing is a major asset of the method of making a heterostructure bipolar transistor described here.

Note that the use of terms such as "vertical" and "horizontal" is only used for reference in particular to the orientation of the drawings and is not intended to imply any particular orientation of the semiconductor device.

The resulting transistor is a heterojunction bipolar transistor with a base formed by base layer 28 between the collector layer 18 and the emitter region 32.

As will be appreciated, these layers should be doped pnp or npn using standard finFET implantations or alternative doping techniques, including for example in-situ doped layer depositions.

Figure 14:
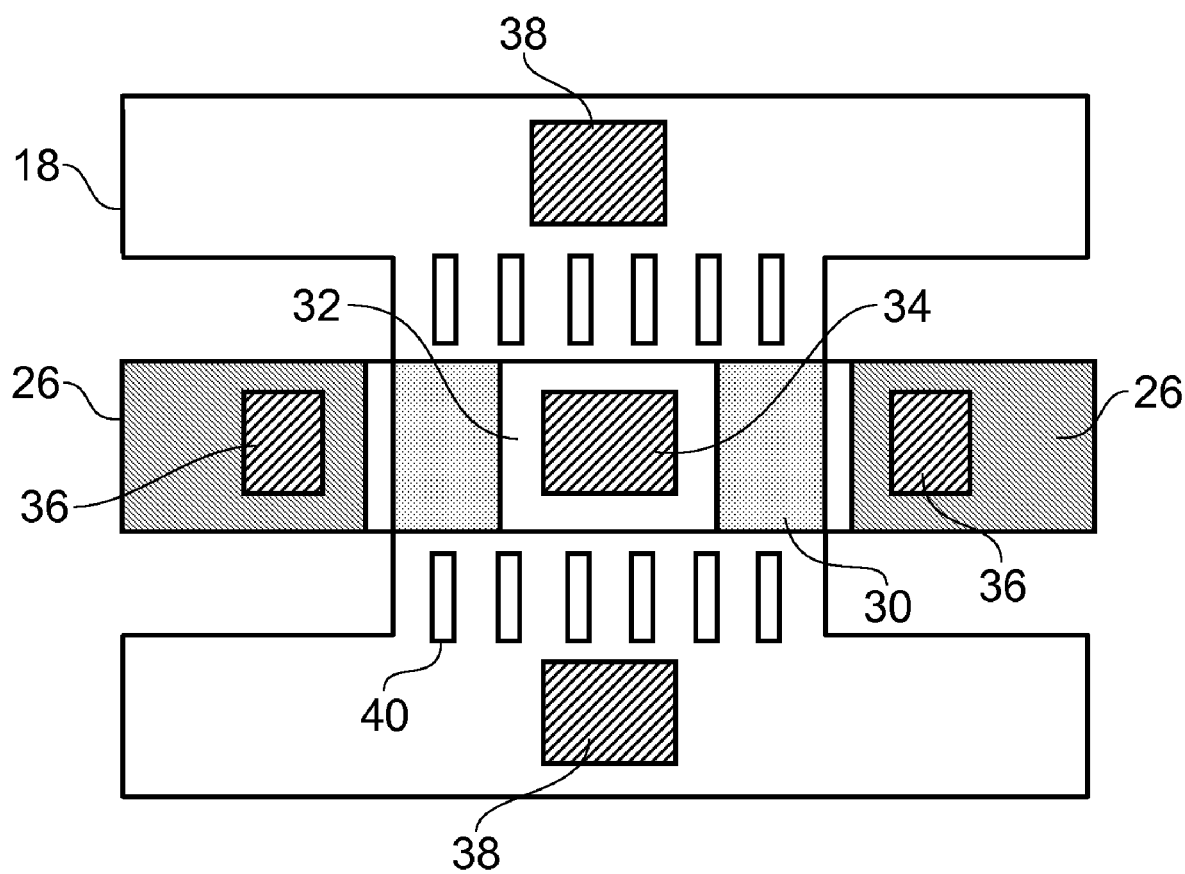
FIG. 14 shows the result of an alternative method according to the invention.

FIG. 14 illustrates a second embodiment in which a plurality of trenches 40 extend into the collector layer 18. Note that these can be formed in the same mask step using hard mask 16 that patterns the collector layer 18 and so no additional steps are required to form these trenches.

The trenches 40 can be used to improve the properties of the transistor using the so-called "RESURF" effect. This improves the breakdown performance of the transistor. The trenches 40 may be filled, for example, with insulator.

Importantly, the process described is highly suitable for integration with CMOS processes, especially FinFET processes.

Note that although the described embodiment has particular materials and thicknesses, these are not essential and may be varied as will be appreciated by the skilled person.

For example, the polysilicon layer 22 could be replaced by a metal layer, or other conducting layer or a number of layers including a metal layer. The specific thicknesses can be varied as required to deal with different processes.

The invention claimed is:

1. A method of manufacturing a bipolar transistor, comprising
   defining a collector region of semiconductor having a central region longitudinally between end regions;
   forming an insulating layer on the lateral sidewalls and top of the collector region in the central region;
   forming base contact regions on both lateral sides of the collector region in the central region;
   forming a gap between the tops of the base contact regions, the gap exposing the collector region in the central region;
   depositing a base semiconductor layer on the exposed collector region in the gap, on the sidewalls of the gap and the tops of the polysilicon base contact region adjacent to the gap;
   forming spacers on the lateral inside edges of the base semiconductor layer in the gap; and
   filling the gap with an emitter semiconductor layer.

2. A method according to claim 1 wherein forming the collector region includes forming the collector region to have a plurality of trenches extending longitudinally between the end region and the central region.

3. A method according to claim 1 wherein the step of forming a collector region includes:
   providing a silicon layer on a substrate;
   depositing and patterning a hard mask over the silicon layer, and
   etching through the full thickness of the silicon layer using the hard mask as a mask to define the collector region.

4. A method according to claim 3 further comprising, after forming the base contact regions, planarising the base contact regions;
   wherein the step of forming a gap includes etching away the insulating layer on the hard mask and the hard mask between the base contact regions.

5. A method according to claim 3 wherein the step of providing a silicon layer on a substrate includes providing a silicon layer on an insulating layer on a substrate.

6. A method according to claim 1 wherein the step of filling the gap with an emitter layer of semiconductor includes:
   depositing an emitter layer of semiconductor over the surface and between the spacers; and
   etching back the semiconductor of the emitter layer leaving the emitter layer only between the spacers.

7. A method according to claim 1 further comprising forming a collector contact on the collector layer in the end regions, a base contact on the base contact regions and an emitter contact on the emitter layer.

8. A method according to claim 1 wherein forming the base contact regions includes:
   depositing a conducting layer over the insulating layer at least in the central region;
   etching back the conducting layer to expose the insulating layer on the top of the collector region in the central region leaving the polysilicon base contact regions on both lateral sides of the collector region.

9. A method according to claim 8 wherein the conducting layer is of polysilicon.

10. A method according to claim 1 wherein the step of defining the collector region defines the collector region to have a lateral width in the range 150 μm to 400 μm in the central region.

11. A method according to claim 1 further comprising forming a finFET in the same process, wherein:
    the step of defining a collector region of semiconductor also defines the fin of the finFET; and
    the step of forming base contact regions on both lateral sides of the collector region in the central region also forms the gate of the finFET.

12. A method according to claim 11 wherein the step of forming an insulating layer on the lateral sidewalls and top of the collector region in the central region also forms the gate insulator of the finFET.

* * * * *